(12) United States Patent
Suzuki et al.

(10) Patent No.: US 9,910,268 B2
(45) Date of Patent: Mar. 6, 2018

(54) SPATIAL LIGHT MODULATOR, PHOTOLITHOGRAPHING APPARATUS, EXPOSURE APPARATUS, AND METHOD OF MANUFACTURING DEVICE

(71) Applicant: NIKON CORPORATION, Tokyo (JP)

(72) Inventors: Yoshihiko Suzuki, Funabashi (JP); Junji Suzuki, Tama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/164,225

(22) Filed: May 25, 2016

(65) Prior Publication Data

US 2016/0266378 A1    Sep. 15, 2016

Related U.S. Application Data

(63) Continuation of application No. PCT/JP2014/080938, filed on Nov. 21, 2014.

(30) Foreign Application Priority Data

Nov. 27, 2013  (JP) .................................. 2013-245010

(51) Int. Cl.
G03F 7/20  (2006.01)
G02B 26/08  (2006.01)

(52) U.S. Cl.
CPC ..... *G02B 26/0841* (2013.01); *G03F 7/70191* (2013.01); *G03F 7/70291* (2013.01)

(58) Field of Classification Search
None
See application file for complete search history.

(56) References Cited

U.S. PATENT DOCUMENTS

| 5,485,304 A | 1/1996 | Kaeriyama |
| 5,629,794 A | 5/1997 | Magel et al. |

(Continued)

FOREIGN PATENT DOCUMENTS

| CN | 101681117 A | 3/2010 |
| JP | H08-62518 A | 3/1996 |

(Continued)

OTHER PUBLICATIONS

Jan. 27, 2015 Search Report issued in International Patent Application No. PCT/JP2014/080938.

(Continued)

*Primary Examiner* — Steven H Whitesell Gordon
(74) *Attorney, Agent, or Firm* — Oliff PLC

(57) ABSTRACT

A spatial light modulator comprises, a first light modulation element having a substrate, a reflecting mirror, a movable portion displaced relative to the substrate while supporting the reflecting mirror, and a top electrode adsorbing the movable portion by electrostatic force between the movable portion and the top electrode in a position farther away from the substrate than the movable portion, a second light modulation element placed adjacent to the first light modulation element in the substrate, having a reflecting mirror, a movable portion displaced relative to the substrate while supporting the reflecting mirror, and a top electrode adsorbing the movable portion by electrostatic force between the movable portion and the top electrode in a position farther away from the substrate than the movable portion, and electrode supporting portions commonly supporting the top electrodes of the first light modulation element and the second light modulation element relative to the substrate.

13 Claims, 31 Drawing Sheets

(56) References Cited

U.S. PATENT DOCUMENTS

| | | | |
|---|---|---|---|
| 6,433,917 B1 * | 8/2002 | Mei | G02B 26/0841 359/291 |
| 6,791,735 B2 * | 9/2004 | Stappaerts | G02B 26/0841 359/245 |
| 9,097,981 B2 | 8/2015 | Hirota | |
| 9,217,860 B2 | 12/2015 | Suzuki et al. | |
| 2002/0105629 A1 * | 8/2002 | Sandstrom | G03F 7/70291 355/71 |
| 2002/0149834 A1 * | 10/2002 | Mei | G02B 6/3512 359/295 |
| 2004/0114259 A1 | 6/2004 | Ishizuya et al. | |
| 2010/0253925 A1 | 10/2010 | Suzuki et al. | |

FOREIGN PATENT DOCUMENTS

| | | |
|---|---|---|
| JP | H09-101467 A | 4/1997 |
| JP | 2003-005102 A | 1/2003 |
| TW | 200928432 A | 7/2009 |
| TW | 201323315 A | 6/2013 |
| WO | 2009/060906 A1 | 5/2009 |

OTHER PUBLICATIONS

Aug. 23, 2016 Office Action issued in Japanese Patent Application No. 2015-550907.

Nov. 28, 2017 Office Action issued in Taiwan Patent Application No. 103141117.

* cited by examiner

SPATIAL LIGHT MODULATOR, PHOTOLITHOGRAPHING APPARATUS, EXPOSURE APPARATUS, AND METHOD OF MANUFACTURING DEVICE

The contents of the following Japanese patent application are incorporated herein by reference:
NO. 2013-245010 filed on Nov. 27, 2013, and
PCT/JP2014/080938 filed on Nov. 21, 2014.

BACKGROUND

1. Technical Field

The present invention relates to a spatial light modulator, a photolithographing apparatus, an exposure apparatus, and a method of manufacturing a device.

2. Related Art

There exists a spatial light modulator comprising a reflecting mirror which is displaced (for example, refer to Patent documents 1 and 2).

Patent document 1: Japanese Patent Application Publication No. 09-101467

Patent document 2: U.S. Pat. No. 6,791,735 Specification

In a spatial light modulator, a support which supports and fixes a member and a driving member such as an electrode compete over the space on a substrate. For this reason, a driving force by the electrode, a driving efficiency, etc. are in a trade-off relationship with the support stiffness of the member due to the support.

SUMMARY

In an embodiment of the present invention, a spatial light modulator comprising, a first light modulation element having a substrate, a reflecting mirror, a movable portion which is displaced relative to the substrate while supporting the reflecting mirror, and a top electrode which adsorbs the movable portion by the electrostatic force between the movable portion and the top electrode in a position father away from the substrate than the movable portion is from the substrate, a second light modulation element placed adjacent to the first light modulation element in the substrate, having a reflecting mirror, a movable portion which is displaced relative to the substrate while supporting the reflecting mirror, and a top electrode which adsorbs the movable portion by the electrostatic force between the movable portion and the top electrode in a position farther away from the substrate than the movable portion is from the substrate, and an electrode supporting portion which supports the top electrode of the first light modulation element and the top electrode of the second light modulation element jointly relative to the substrate, is provided.

The above overview of the invention does not list all of the features of the present invention. A sub-combination of these features may also be an invention.

DESCRIPTION OF EXEMPLARY EMBODIMENTS

Hereinafter, the present invention is described through the embodiments of the invention. However, the following embodiments do not limit the invention according to the scope of claim. Also, not all of the combinations of the features described in the embodiments are necessarily essential for solving the problems of the invention.

Figure 1:
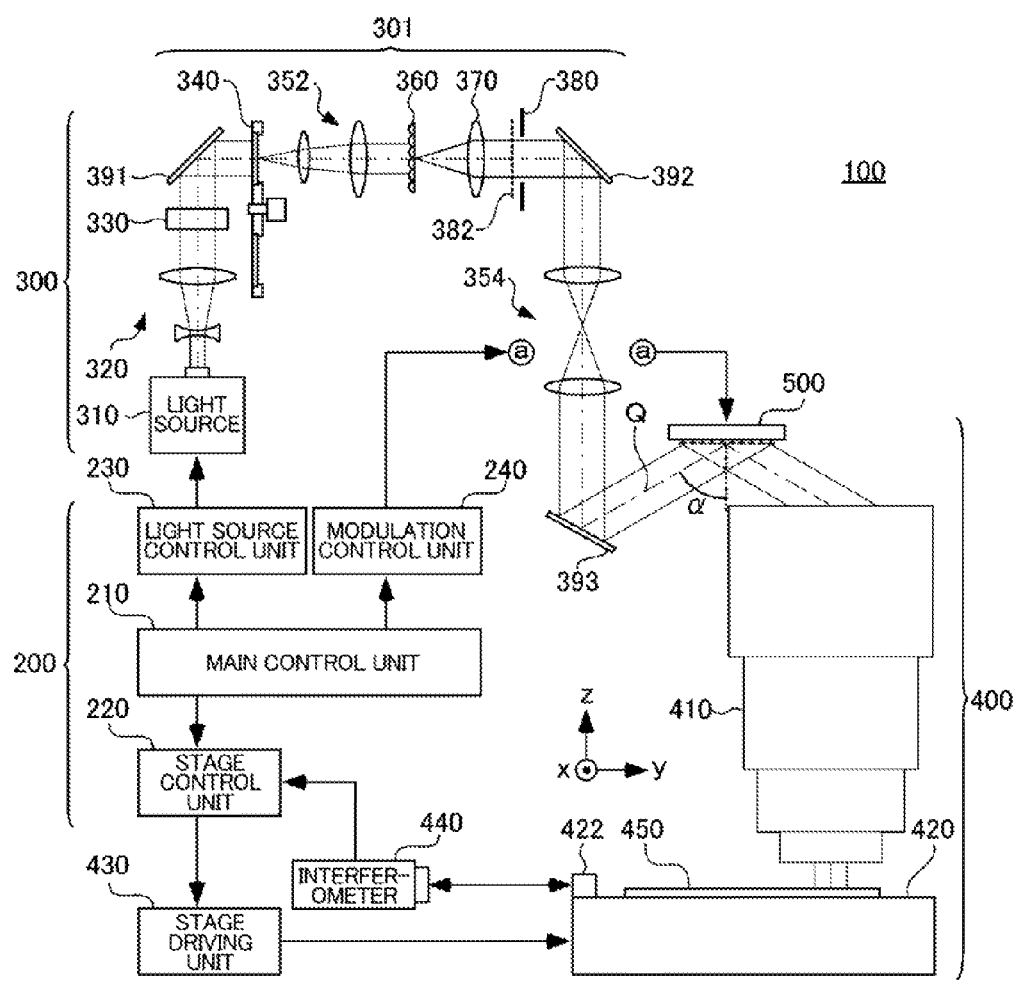
FIG. 1 is a schematic view of the semiconductor exposure apparatus 100.

FIG. 1 is a schematic view showing the structure of the semiconductor exposure apparatus 100. The semiconductor exposure apparatus 100 comprises a control system 200, an illumination system 300 and a photolithographing system 400. The photolithographing system 400 includes a spatial light modulator 500.

The control system 200 has a main control unit 210, a stage control unit 220, a light source control unit 230, and a modulation control unit 240. The stage control unit 220 controls a stage driving unit 430, the light source control unit 230 controls a light source 310, and the modulation control not 240 controls the spatial light modulator 500, respectively and individually.

In contrast, the main control unit 210 controls the entire semiconductor exposure apparatus 100 that includes the stage control unit 220, the light source control unit 230, and the modulation control unit 240 as a whole.

Also, the main control unit 210 comprises an interface for a user and notifies outside the semiconductor exposure apparatus 100 of the operative state of the semiconductor exposure apparatus 100 as it accepts an instruction from the user.

The illumination system 300 comprises the light source 310 and the optical system 301. The light source 310 is provided with a triggered pulse which instructs a timing of light emission and the light emission intensity from the light source control unit 230 to emit light pulses. The pulsed light generated by the light source 310 is approximately a parallel light flux, and it comprises a cross-section shape of a rectangular beam.

For the light source 310, for example, a YAG laser which emits light pulses of a laser beam with a wavelength of 193 nm and a pulse width of approximately 1 ns at a frequency of approximately 1 to 3 MHz, a semiconductor laser, etc. can be used. Also for the light source 310, an ArF excimer laser which emits light pulses of a laser beam with a wavelength of 193 nm and a pulse width of approximately 50 ns at a frequency of approximately 4 to 6 kHz, a KrF excimer laser which emits light with a wavelength of 248 nm, a light emitting diode in which pulse lighting is used, etc. can be used.

The optical system 301 comprises optical members such as a beam expander 320, a polarization control optical element 330, a diffraction optical element 340, relay optical systems 352, 354, a microlens array 360, a relay lens, a field stop 380, etc. The beam expander 320 enlarges the beam diameter of a pulsed light generated by the light source 310.

The polarization control optical element 330 in the optical system 301 controls the polarization state of the pulsed light. For the polarization control optical element 330, a ½ wavelength plate which rotates the polarization direction of the pulsed light, a ¼ wavelength plate which converts the pulsed light into circular polarization, a birefringent prism which converts the pulsed light into random polarization (non-polarization), etc. are properly selected and arranged.

In the diffraction optical element 340 in the optical system 301, one of a plurality of elements held in a turret is inserted in the optical path of the pulsed light. For the diffraction optical element 340, a small-σ illuminating element which produces an illumination light with a small coherence factor (σ-value), a bipolar illumination element, a quadrupolar illumination element, an orbicular illumination element, etc. in addition to a typical illumination element are used. For the diffraction optical element 340, a reflective spatial modulating element can also be used.

In the optical system 301, the pulsed light emitted from the diffraction optical element 340 is directed to the microlens array 360 by the relay optical system 352. The microlens array 360 in the optical system 301 two-dimensionally divides the pulsed light by many microscopic lens elements and forms a secondary light source (surface light source) on an illumination pupil surface of the optical system 301 which is also a rear focal plane. A zoom lens may be used for the relay optical system 352. Also a fly-eye lens may be used for the microlens array 360.

The illumination light emitted from the secondary light source formed on the illumination pupil surface is irradiated toward a spatial light modulator 500 through the relay lens 370, the field stop 380, and another relay optical system 354. The field stop 380 is provided in a position shifted from the plane COP 382 conjugate with an object surface of the projection optical system 410 in the direction of the optical axis.

The illumination light irradiated on the spatial light modulator 500 comprises an approximately uniform illuminance. Also the illumination light is incident with an incident angle α which has a predetermined constant tilt with respect to the reflective surface of the spatial light modulator 500.

The optical system 301 further comprises a plurality of reflecting mirrors 391, 392, 393 which are inserted onto the optical path. The reflecting mirrors 391, 392, 393 make the semiconductor exposure apparatus 100 compact by bending the optical path of the illumination light The photolithographing system 400 includes the spatial light modulator 500, the projection optical system 410, and a wafer stage 420. The spatial light modulator 500 forms an illuminance distribution for the illumination light irradiated with a uniform illuminance under the control by the modulation control unit 240.

The projection optical system 410 forms a reduced projection optical system that is non-telecentric on the spatial light modulator 500 side and telecentric on the wafer stage 420 side. Also, the spatial light modulator 500 and the surface of the semiconductor wafer 450 mounted on the wafer stage 420 are positioned in a conjugated relationship relative to the projection optical system 410.

Thereby, the projection optical system 410 forms a reduced image of the spatial image comprising the distribution formed by the spatial light modulator 500 on a surface of the semiconductor wafer 450, and exposes the resist film applied on the semiconductor wafer 450 to light. The semiconductor wafer 450 may be a compound semiconductor, etc. in addition to single crystal silicon.

The projection optical system 410 comprises as a protection magnification β of, for example, approximately 1/10 to 1/100. Also, the resolution of the projection optical system 410 is, for example, from one to several times the resolution of the spatial light modulator 500. In other words, by improving the resolution of the spatial light modulator 500, the resolution of the projection optical system 410 can be improved.

And now, the control system 200, the illumination system 300, the spatial light modulator 500, and the projection optical system 410 are each fixed with respect to the semiconductor exposure apparatus 100. In contrast, the wafer stage 420 is driven by the stage driving unit 430 and displaced in the scanning direction y shown by the arrow in the figure. Thereby, the surface of the semiconductor wafer 450 can be scanned by the projected light entitled from the projection optical system 410.

A reflecting mirror 422 is also mounted on the wafer stage 420. The reflecting mirror 422 comprises a reflective surface orthogonal to the movement direction of the wafer stage 420, and reflects the laser beam irradiated from an interferometer 440 toward the interferometer 440. Thereby, the stage control unit 220 detects the movement amount of the wafer stage 420 with a good precision and controls the stage driving unit 430 with a high precision.

In this manner, in the semiconductor exposure apparatus 100, the semiconductor wafer 450 can be exposed to light by the projected light with a pattern formed in a maskless manner without using a mask or reticle. Also, by moving the wafer stage 420, the entire surface of the semiconductor wafer 450 can be exposed to light.

Thus, by repeating the lithographic exposures, many exposure patterns can be formed on the surface of the semiconductor wafer 450. Also, by changing the pattern for every shot, a pattern larger than the projected area of the projection optical system 410 can be formed on the semiconductor wafer 450. In addition, a different pattern can also be formed depending on the region of the semiconductor wafer 450.

Figure 2:
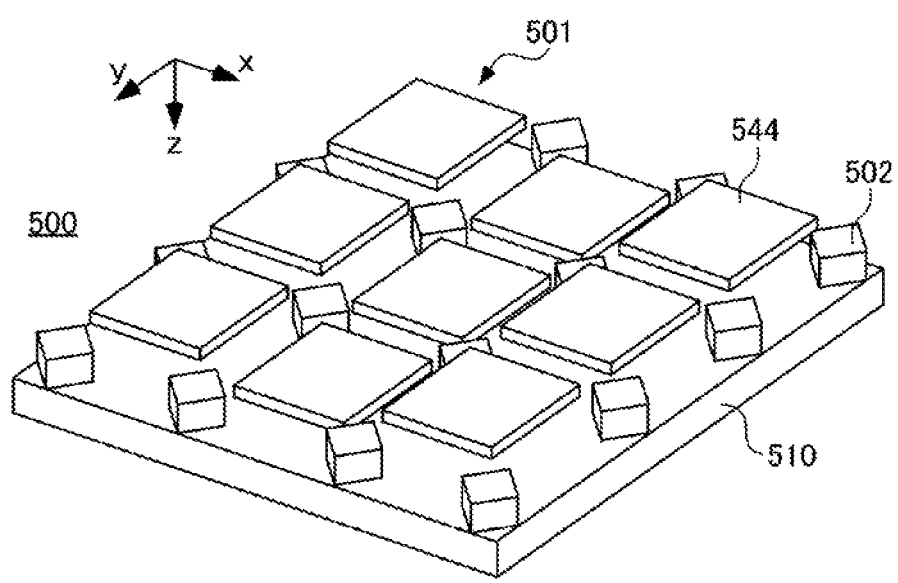
FIG. 2 is a schematic perspective view of the spatial light modulator 500.

FIG. 2 is a schematic perspective view of the spatial light modulator 500 alone. The spatial light modulator 500 comprises a substrate 510 and a plurality of spatial light modulation elements 501 aligned on the substrate 510. Each of the spatial light modulation elements 501 is formed by MEMS (Micro Electro Mechanical Systems) technique and respectively includes supports 502 and a reflecting mirror 544.

Each of the supports 502 is fixed relative to the substrate 510 and supports a member forming the spatial light modulation element 501 such as the reflecting mirror 544. In contrast, each of the reflecting mirrors 544 comprises a square-shaped reflective surface with a side approximately several μm to a hundred and several tens of μm and is displaceably supported so as to individually approach or recede from the substrate 510.

Figure 3:
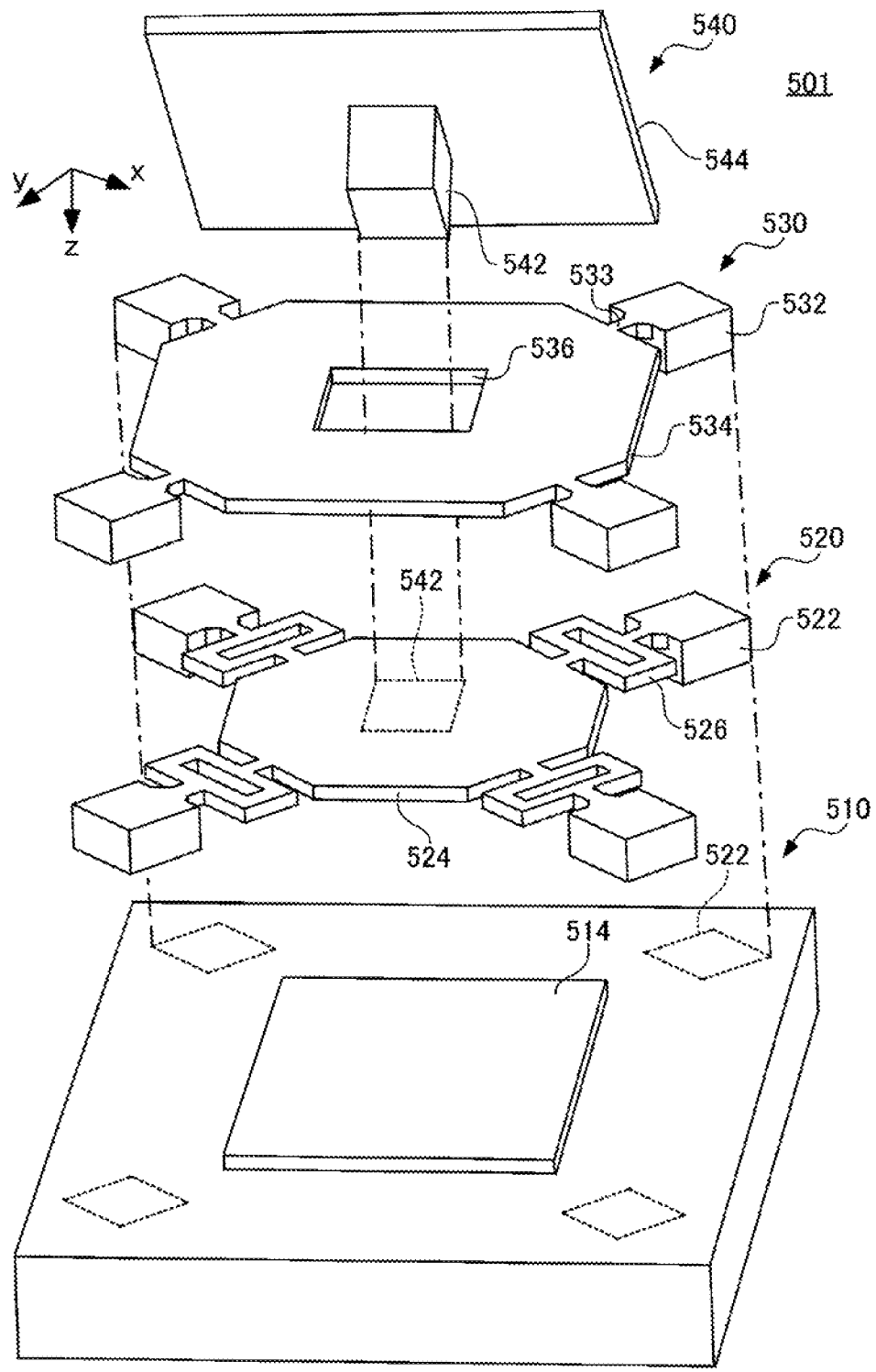
FIG. 3 is a schematic exploded perspective view of the spatial light modulation element 501.

FIG. 3 is an exploded perspective view of the spatial light modulation element 501 alone which corresponds to one reflecting mirror 544. The spatial light modulation element 501 comprises the substrate 510, a movable portion 520, a fixed portion 530, and a reflecting portion 540. In FIG. 3, the substrate 510, the movable portion 520, and the fixed portion 530 are depicted in a state of being looked down from above, while the reflecting portion 540 is depicted in a state of being looked up in order to show the feature of the shape.

FIG. 3 is a figure showing the hierarchic layout of functional elements in the spatial light modulation element 501 and not a figure straightforwardly showing the physical structure of the spatial light modulation element 501. For this reason, the structure shown in FIG. 3 does not match with the layer structure of the spatial light modulation element 501 formed with the thin film in an embodiment described later by referring to FIG. 4 and the following figures.

The substrate 510 comprises a CMOS circuit built inside thereof as a driving circuit of the spatial light modulation element 501 and a lower electrode 514 on the surface. The lower electrode 514 is coupled with the CMOS circuit inside the substrate 510, and the driving voltage is applied thereto from the CMOS circuit.

The movable portion 520 comprises supports 522, flexures 526, and a movable electrode 524. Four supports 522 are provided and fixed in the vicinities of the four corners of the rectangular region occupied by the spatial light modulation elements 501 on the substrate 510 as shown with a dotted line in the figure. The support 522 makes a portion of the support 502 shown in FIG. 2.

The flexures 526 couple the single movable electrode 524 and the four supports 522 respectively. The flexure 526 each comprises a circular portion and allows a displacement relative to the support 522 of the movable electrode 524 by becoming deformed.

The movable electrode 524 is supported b the supports 522 via the flexures 526 so that the movable electrode 524 is displaceably arranged relative to the substrate 510. The movable electrode 524 is supported by the four flexures 526 arranged radially from the four corners, and it is arranged in parallel to the substrate 510. In case the movable electrode 524 is displaced, it is displaced in the direction in which it approaches or recedes from the substrate 510, shown by the arrow z in the figure.

The fixed portion 530 comprises supports 532 and a top electrode 534. The supports 532 are coupled to the supports 522 of the movable portion 520 and extend the supports 522 in the direction in which they recede from the substrate 510. Thereby, the supports 532 support the top electrode 534 in the position away from the substrate 510 and from the movable electrode 524. The support 532 makes a portion of the support 502 shown in FIG. 2.

The top electrode 534 is coupled to the supports 532 by the coupling portions 533 and arranged in parallel to the substrate 510. The coupling portions 533 are short, so the top electrode 534 is fixed without being displaced relative to the supports 532. Also, the top electrode 534 is supported between the four supports 532, so it is hardly deformed even when a mechanical load is externally applied.

In addition, the top electrode 534 comprises an opening portion 536 approximately in the center. The opening portion 536 penetrates the top electrode 534 in the direction of thickness. Thereby, a reflecting portion 540 described later can be coupled with the movable electrode 524 of the movable portion 520.

The reflecting portion 540 comprises a support member 542 and a reflecting mirror 544. The reflecting mirror 544 comprises a rectangular plane which covers a large portion of the spatial light modulation element 501. In the reflecting mirror 544, a reflective surface with a high reflectivity formed with a metallic thin film, etc. is provided on the surface opposite to the substrate 510.

The upper end of the support member 542 in the figure is coupled integrally relative to the reflecting mirror 544 on the side opposite to the reflective surface in the reflecting mirror 544, in other words, approximately in the center on the side facing the substrate 510. Also, the support member 542 extends from the reflecting mirror 544 toward the substrate 510, and is coupled with the approximate center of the movable electrode 524 after it penetrates the opening portion 536 of the top electrode 534. Thereby, the reflecting portion 540 is displaceably supported in an integral manner with the movable electrode 524, relative to the substrate 510.

As it can be seen from the illustrated layout, the lower electrode 514, the movable electrode 524, and the top electrode 534 involved in the driving of the spatial light modulation element 501 and the supports 522, 532 supporting the movable electrode 524 and top electrode 534 are in a relationship for competing over the space in the direction of the face of the substrate 510. For this reason, it for example, the occupied areas of the supports 522 and 532 or the numbers of the supports 522 and 532 are increased for the purpose of increasing the support stiffness of the top electrode 534, the areas of the lower electrode 514, the movable electrode 524, and the top electrode 534 become smaller, and the driving force or driving efficiency of the spatial light modulation element 501 drops. On the one hand, if the areas of the lower electrode 514, the movable electrode 524, and the top electrode 534 are enlarged for the purpose of improving the driving force of the spatial light modulation element 501, the areas or the numbers of the supports 522, 532 decrease, and particularly the support stiffness of the top electrode 534 drops.

FIG. 4 through FIG. 26 are cross-sectional views showing the process of manufacturing the spatial light modulator 500 including the spatial light modulation elements 501 per stage. These drawings are shown by the cross section cut at a diagonal line in a plan view of the rectangular spatial light modulation element 501. Note that FIGS. 18, 20, and 22 are plan views of the spatial light modulator 500 in the process of manufacturing. Also, FIG. 11 through FIG. 26 help understand the layer structure by collectively representing the plurality of layers as a sacrifice layer 610, a conductor layer 630, or an insulation layer 640.

In the spatial light modulator 500 of the process of manufacturing, there are cases when the element of the spatial light modulation element 501 is included with a shape or state that is different from a completed state. Then, after reference numerals specific to these drawings are given and described in the descriptions of FIG. 4 through FIG. 25, the correspondence relationship with the elements of the spatial light modulator 500 shown in FIG. 1 through FIG. 3 is described in FIG. 26.

Figure 4:
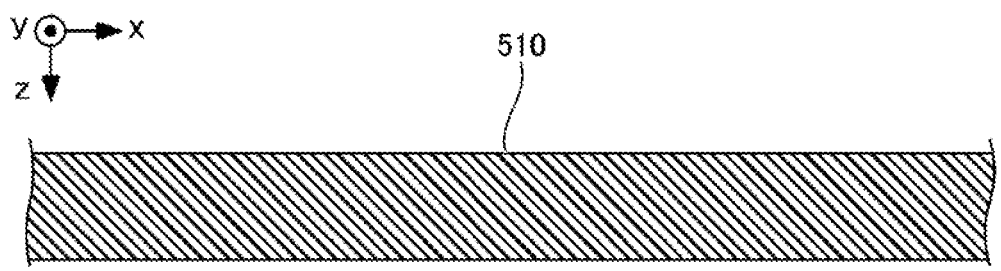
FIG. 4 is a cross-sectional view showing the process of manufacturing the spatial light modulator 500.

When the spatial light modulator 500 is manufactured, the flat substrate 510 is prepared as shown in FIG. 4. As the material of the substrate 510, a member comprising as flat surface such as a compound semiconductor substrate, a ceramic substrate, etc. in addition to a single crystal silicon substrate can be broadly used. In an example illustrated in the figure, the substrate 510 is formed by the single crystal silicon, and the CMOS circuit driving the spatial light modulator 500 is already formed in the substrate 510.

Figure 5:
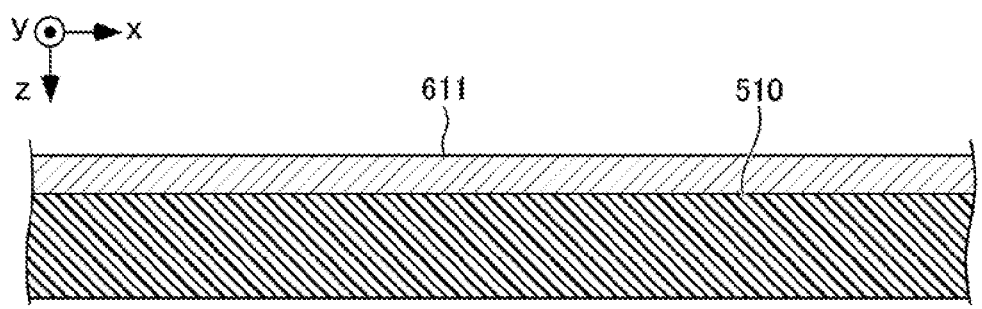
FIG. 5 is a cross-sectional view showing the process of manufacturing the spatial light modulator 500.

First, as shown in FIG. 5, a sacrifice layer 611 is formed on a surface of the substrate 510. The sacrifice layer 611 can be formed by, for example, prebaking a resist applied by spin coating, spray coating, etc., and cover the entire substrate 510 with an approximately uniform thickness. A mask used when a conductor material, an insulating material, etc. is deposited on the substrate 510 can be formed by patterning this sacrifice layer 611 by photolithography.

Figure 6:
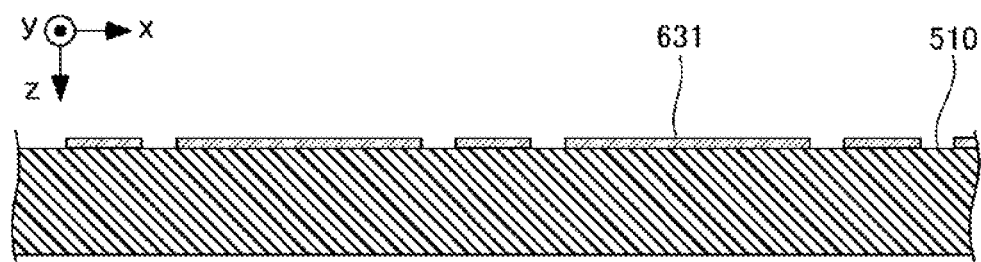
FIG. 6 is a cross-sectional view showing the process of manufacturing the spatial light modulator 500.

FIG. 6 shows a conductor layer 631 formed by the conductor material deposited on the substrate 510 using the mask formed by the sacrifice layer 611. A portion of the conductor layer 631 eventually forms a lower electrode 514. Also, the other portion of the conductor layer 631 is electrically coupled with the movable electrode 24 or top electrode 534.

Figure 7:
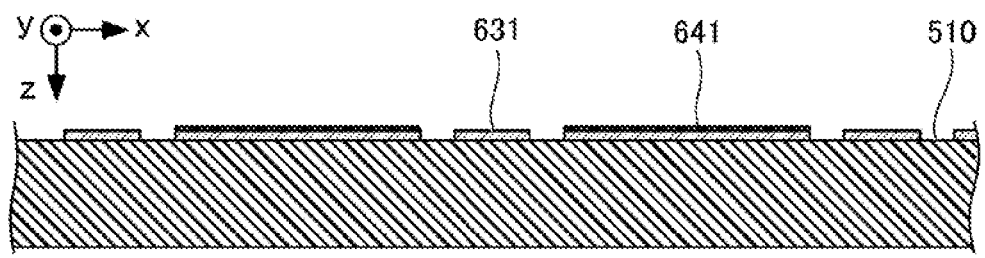
FIG. 7 is a cross-sectional view showing the process of manufacturing the spatial light modulator 500.

Then, as shown in FIG. 7, an insulation layer 641 covering a portion of the conductor layer 631 is formed. The insulation layer 641 can be formed by patterning the insulation layer 641 deposited by the physical vapor deposition method or chemical vapor deposition method, etc. on the substrate 510 and the conductor layer 631, with dry etching or wet etching that uses a resist layer formed by photolithography, etc. as a mask.

Figure 8:
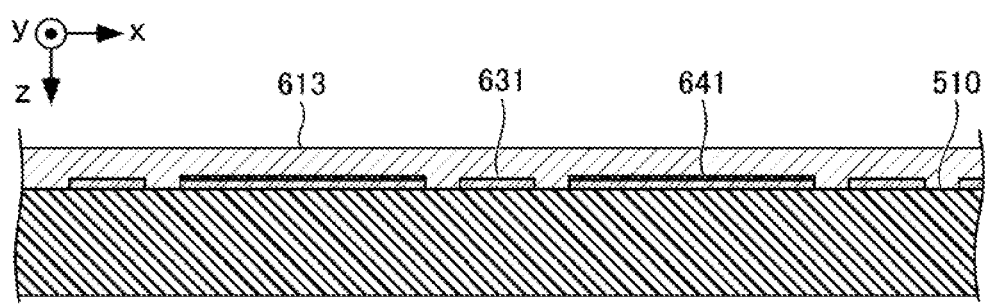
FIG. 8 is a cross-sectional view showing the process of manufacturing the spatial light modulator 500.

Subsequently, as shown in FIG. 8, in the state in which a portion of the conductor layer 631 is covered with the insulation layer 641, the entire surfaces of the substrate 510, conductor layer 631 and insulation layer 641 are flattened again with the sacrifice layer 613. The position of the surface of the flattened sacrifice layer 613 is equal to the height of a face opposite to the substrate 510 in the movable electrode 524. The sacrifice layer 613 can be formed by a method similar to the sacrifice layer 611.

Figure 9:
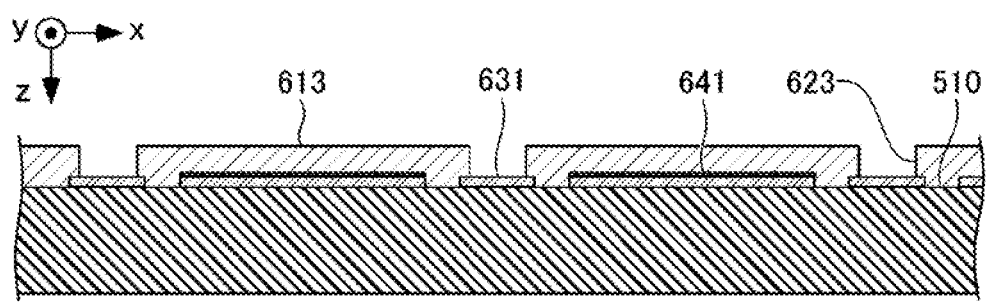
FIG. 9 is a cross-sectional view showing the process of manufacturing the spatial light modulator 500.

Then, as shown in FIG. 9, an opening pattern 623 is formed by patterning the sacrifice layer 613, and a portion of the region in the conductor layer 631 that is not covered with the insulation layer 641 is exposed. The opening pattern 623 is narrower than the exposed conductor layer 631, exposes the central part of the conductor layer 631, and brings the edge portion to a state in which it is covered with the sacrifice layer 613.

Figure 10:
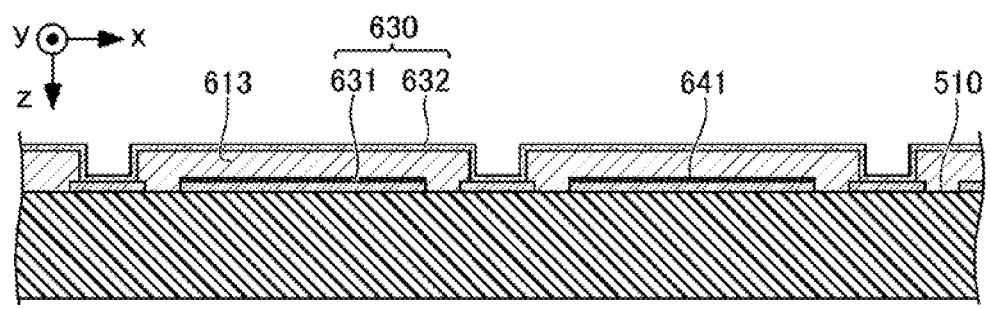
FIG. 10 is a cross-sectional view showing the process of manufacturing the spatial light modulator 500.

Then, as shown in FIG. 10, the conductor material is deposited on the entire surface of the sacrifice layer 613 and the entire exposed portion of the conductor layer 631 to form a conductor layer 632. The conductor layer 632 can be, for example, formed by depositing a metallic material such as TiAl alloy by the physical vapor deposition method, chemical vapor deposition method, or plating method, etc. A portion of the formed conductor layer 632 eventually becomes a movable portion 520.

Figure 11:
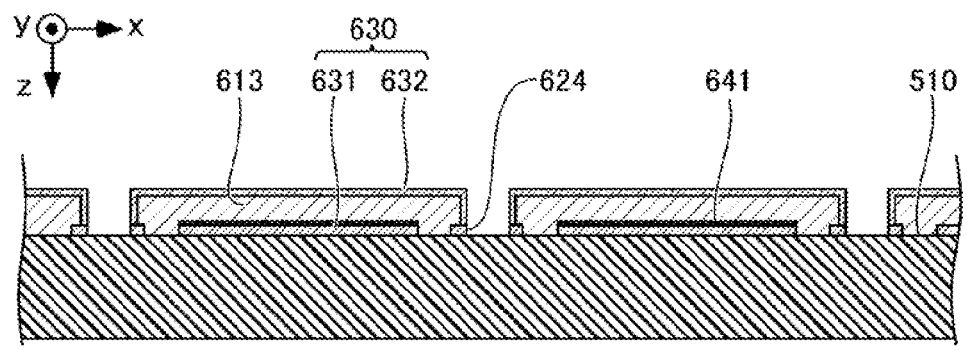
FIG. 11 is a cross-sectional view showing the process of manufacturing the spatial light modulator 500.

Then, as shown in FIG. 11 portions of the conductor layers 632 and 631 are removed. The conductor layers 632 and 631 can be simultaneously removed by dry etching using a mask such as plasma etching, reactive ion etching, and ion milling. Thereby, an opening pattern 624 in which the surface of the substrate 510 is exposed inside is formed.

Figure 12:
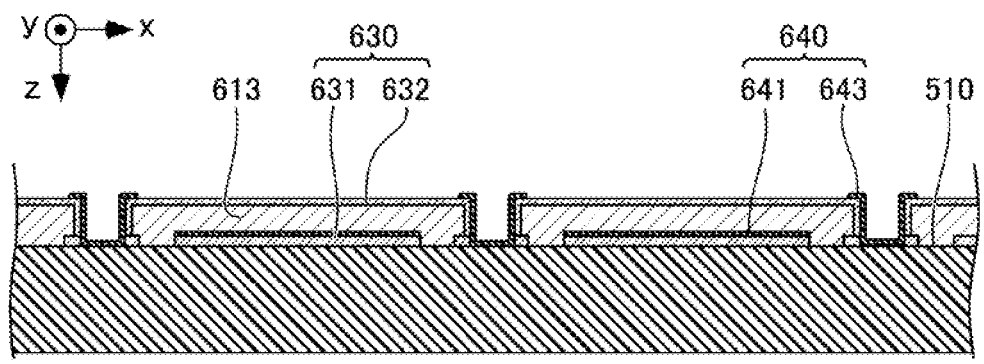
FIG. 12 is a cross-sectional view showing the process of manufacturing the spatial light modulator 500.

Then, as shown in FIG. 12, an insulation layer 643 is further deposited inside the opening pattern 625. Thereby, portions of a side surface of the conductor layer 632 and a top surface of the conductor layer 632 are covered with the insulation layer 643. The insulation layer 643 can be formed by a method and materials similar to the previously formed insulation layer 641.

Figure 13:
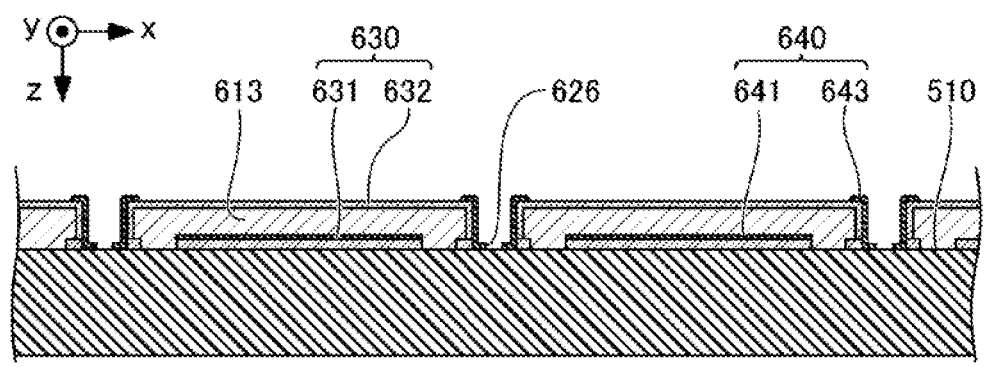
FIG. 13 is a cross-sectional view showing the process of manufacturing the spatial light modulator 500.

Then, as shown in FIG. 13, a portion of the insulation layer 643 is removed. The insulation layer 643 can be simultaneously removed by dry etching using a mask such as plasma etching reactive ion etching, and ion milling. Thereby, an opening pattern 626 which exposes a portion of the surface of the substrate 510 is formed in a state in which it is insulated from the conductor layer 632.

Figure 14:
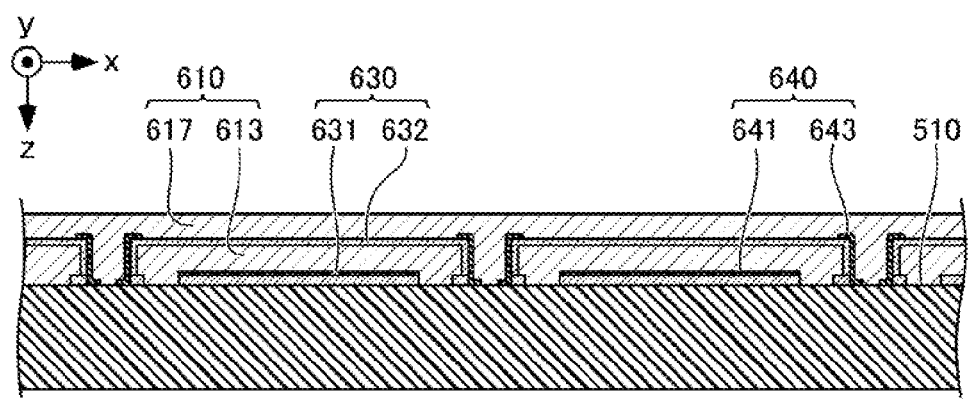
FIG. 14 is a cross-sectional view showing the process of manufacturing the spatial light modulator 500.

Subsequently, as shown in FIG. 14, the entire surfaces of the substrate 510, the conductor layer 632, and the insulation layer 643 are covered with the sacrifice layer 617 and flattened. The position of the flattened surface of the sacrifice layer 617 is equal to the position of a face opposite to the movable electrode 524 in the top electrode 534. The sacrifice layer 613 can also be formed by a method similar to the other sacrifice layer 611, etc.

Figure 15:
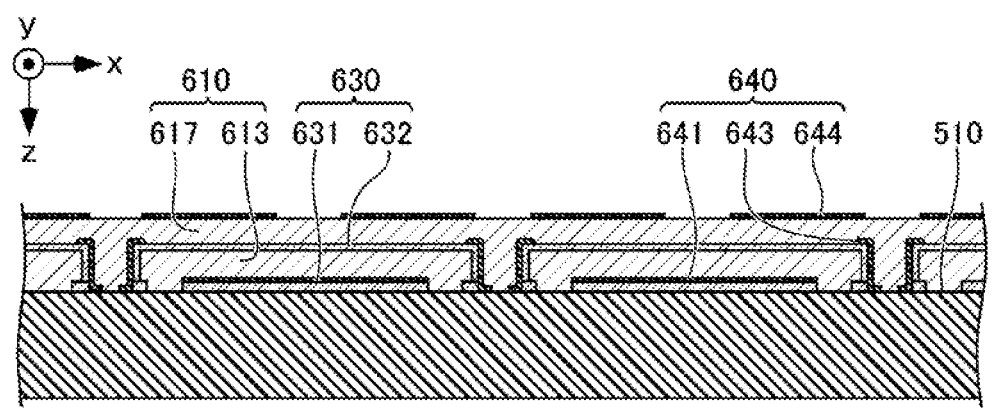
FIG. 15 is a cross-sectional view showing the process of manufacturing the spatial light modulator 500.

Then, as shown in FIG. 15, an insulation layer 644 on which patterning is performed is formed on a surface of the sacrifice layer 617. The insulation layer 644 can be simultaneously removed by dry etching using a mask such as plasma etching, reactive ion etching, and ion milling, as with the other insulation layers 644. The insulation layer 644 formed in this manner comprises approximately the same shape as the pattern of the top electrode 534 and comprises approximately the same external form as the top surface of the conductor layer 632, as well as comprising an opening in the center to form a circular shape.

Figure 16:
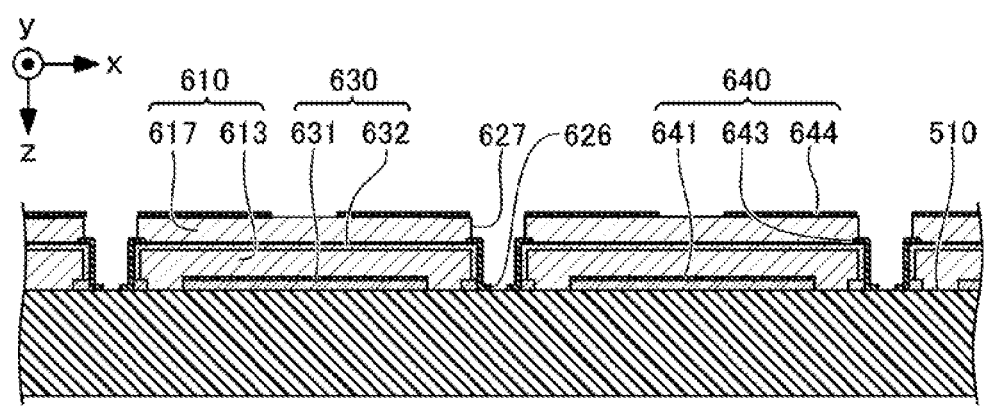
FIG. 16 is a cross-sectional view showing the process of manufacturing the spatial light modulator 500.

Then, as shown in FIG. 16, in the region where the conductor layer 632 terminates, a portion of the sacrifice layer 617 is removed. Thereby, an opening pattern 627 is formed in the sacrifice layer 617. Also, a part of the portion where the insulation layer 643 extends horizontally and the operating pattern 626 which exposes the substrate 510 to the inner side of the insulation layer 643 appear outside.

Figure 17:
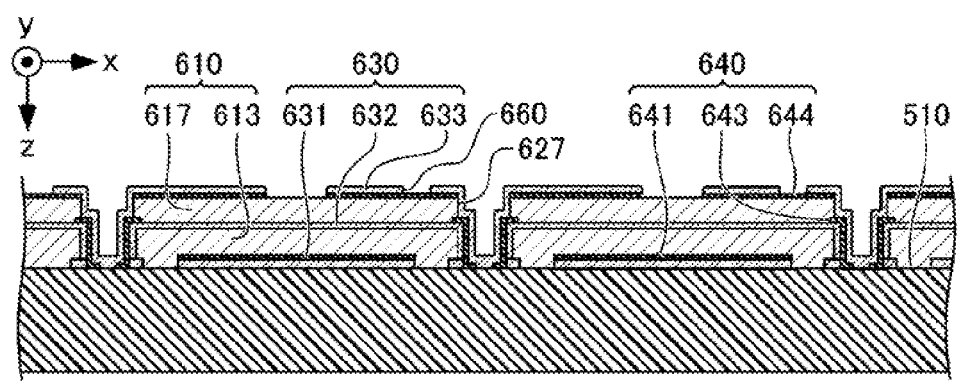
FIG. 17 is a cross-sectional view showing the process of manufacturing the spatial light modulator 500.
Figure 18:
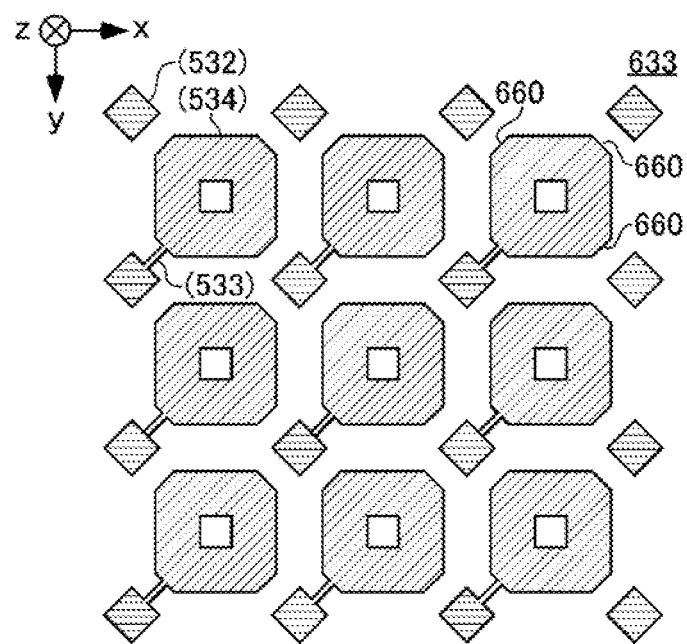
FIG. 18 is a figure showing the planar shape of the conductor layer 633.

Subsequently, as shown in FIG. 17, a conductor layer 633 is formed so that it is placed over the insulation layers 643 and 644. Also, the conductor layer 633 covers a side surface of the sacrifice layer 617 as well which appears between the insulation layer 643 covering the side surface of the conductor layer 632 and the insulation layer 644 formed on the top surface of the sacrifice layer 617. In addition, the conductor layer 633 comprises a slit pattern 660 of which a portion terminates on the top surface of the insulation layer 644.

FIG. 18 is a figure schematically showing the planar shape of the conductor layer 633 in the state shown in FIG. 17. The conductor layer 633 comprises a circular portion eventually to be the top electrode 534, a portion eventually to be the support 532 surrounding the portion to be the top electrode 534, and a portion to be the coupling portion 533 coupling one of the portions to be the support 532 and the portion to be the top electrode 534. Also, the other three portions of the portions to be the four supports 532 surrounding one of the portions to be the top electrodes 534 are separated from the portion to be the top electrode 534, with a slit pattern 660 placed between them.

Figure 19:
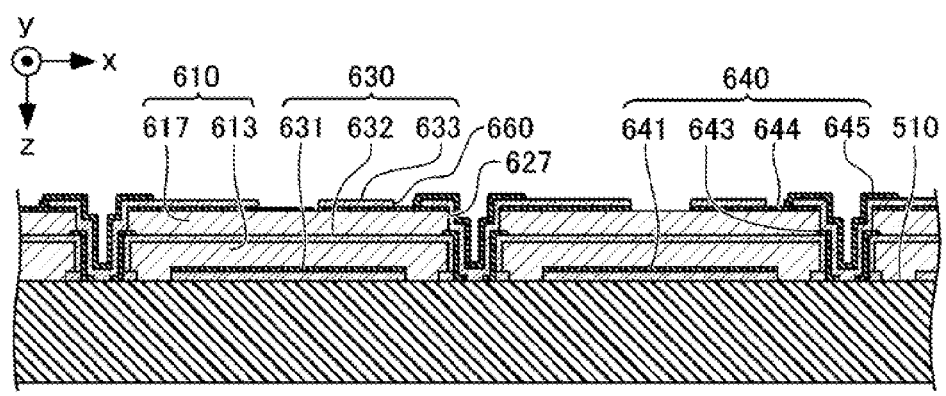
FIG. 19 is a cross-sectional view showing the process of manufacturing the spatial light modulator 500.
Figure 20:
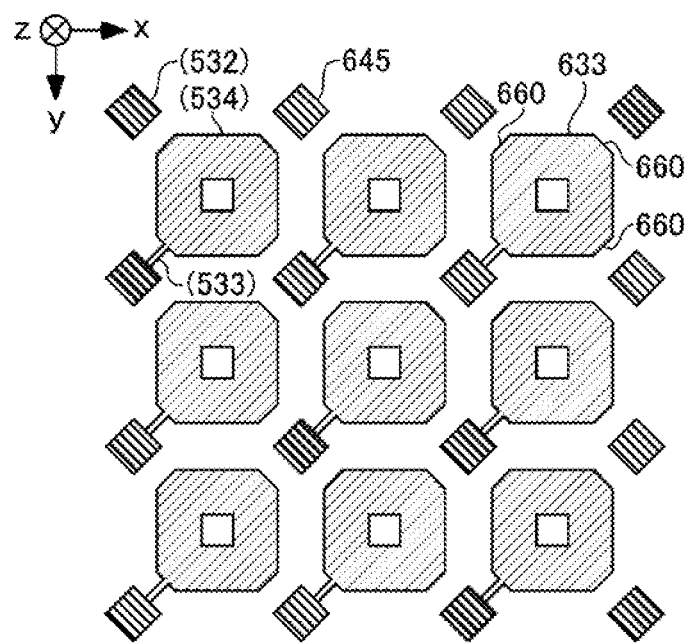
FIG. 20 is a figure showing the planar shape of the conductor layer 633 and insulation layer 645.

Then, as shown in FIG. 19, an insulation layer 645 is formed in the region in which the conductor layer 632 is separated. In the cross section illustrated in the figure, one end of the insulation layer 645 contacts the insulation layer 644 positioned a lower layer of the conductor layer 633, in the inner side at the slit pattern 660. Thus, in the inside of the slit pattern 660, one end portion of the conductor layer 633 is covered by the insulation layer 644, 645 and insulated from the other end portion.

Also, the insulation layer 645 covers the surface of the conductor layer 633 in the vicinity of the opening pattern 627. The insulation layer 645 as this can be formed by the same method and materials as the other insulation layers 641 to 644.

FIG. 20 is a figure schematically showing the planar shape of the insulation layer 645 in the state shown in FIG. 19. The conductor layer 633 covers the top surface in all of the four portions which eventually become the supports 532. Thereby, the insulation layer 645 further insulates the conductor layer 633 from the layer which is a layer even above the insulation layer 645.

Figure 21:
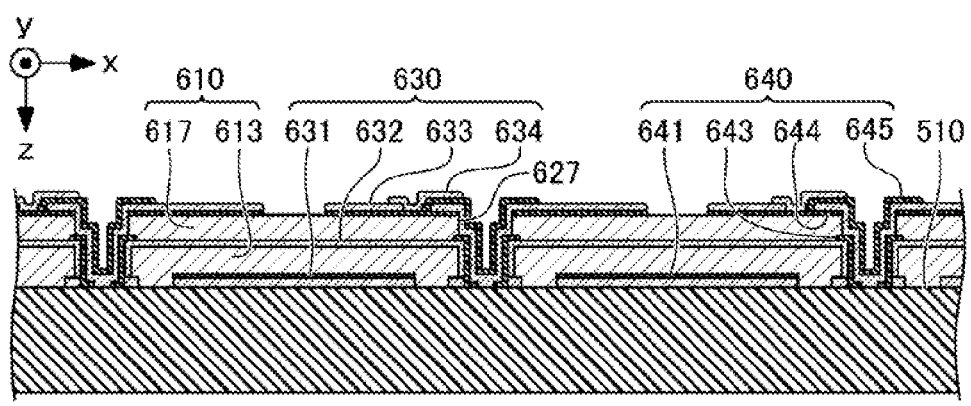
FIG. 21 is a cross-sectional view showing the process of manufacturing the spatial light modulator 500.
Figure 22:
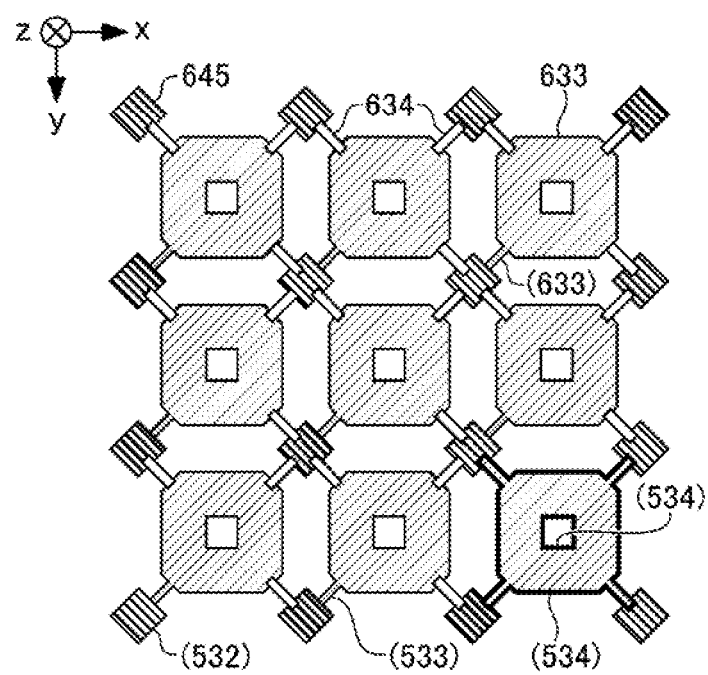
FIG. 22 is a figure showing the planar shape of the conductor layer 633 and conductor layer 634.

Then, as shown in FIG. 21, the conductor layer 634 is formed on the top surface of the slit pattern 660. The conductor layer 634 straddles the top surfaces of the conductor layer 633 and the insulation layer 645 with the slit pattern 660 placed between them. The conductor layer 634 can be formed by the same method and materials as the other conductor layers 631 to 633.

FIG. 22 is at figure schematically showing the positional relationship between the conductor layers 633, 634 and the insulation layer 645 in the state shown in FIG. 21. In the conductor layer 633, four portions to be the supports 532 are arranged in the surrounding of the portion to be the top electrode 534.

One of these portions to be the supports 532 is mechanically and also electrically coupled by the portion to be the coupling portion 533 in the conductor layer 633 as described by referring to FIG. 18. However, the other three portions of the portions to be the supports 532 are coupled with the top electrode 534 by the conductor layer 634 formed in the stages shown in FIG. 21.

Each of the conductor layers 634 is formed over the insulation layer 645, and thus is insulated with respect to the conductor layer 633 covered by the insulation layer 645. In other words, one of the four supports 532 surrounding the top electrode 534 is electrically coupled with the top electrode 534 and the other three are not coupled. Thus, the plurality of top electrodes 534 formed in the spatial light modulator 500 are electrically independent from each other.

On the one hand, each of the top electrodes 534 is mechanically coupled with respect to all of the four supports 532 surrounding the top electrode 534 by either of the conductor layer 633 or the conductor layer 634. Thus, the top electrode 534 is solidly positioned by the plurality of supports 532. Also, when a load displacing the top electrode 534 acts on the top electrode 534, the tension acts on the top electrode 534 among the plurality of supports 532. Thereby, the top electrode 534 is hardly deformed when a mechanical load acts on it.

In addition, the supports 532 supporting the movable electrode 524 and the top electrode 534 in each of the spatial light modulation elements 501 also function as the supports 532 supporting the movable electrode 524 and the top electrode 534 of the adjacent spatial light modulation elements 501. Thus, the ratio of the area contributing to light modulation can be increased by suppressing the number of the supports 532 in the entire spatial light modulator 500.

On the one hand, each of conductor layers 634 is electrically coupled with the portion to be the top electrode 534 of the conductor layer 633. Thus, the shape of the top electrode 534 with the conductor layer 633 and the conductor layer 634 coupled is a point-symmetrical shape with respect to the center of the opening portion 536 centrally positioned in the top electrode 534. Thus, the occurrence of bias in the electrostatic force acting on the top electrode 534 is suppressed.

Figure 23:
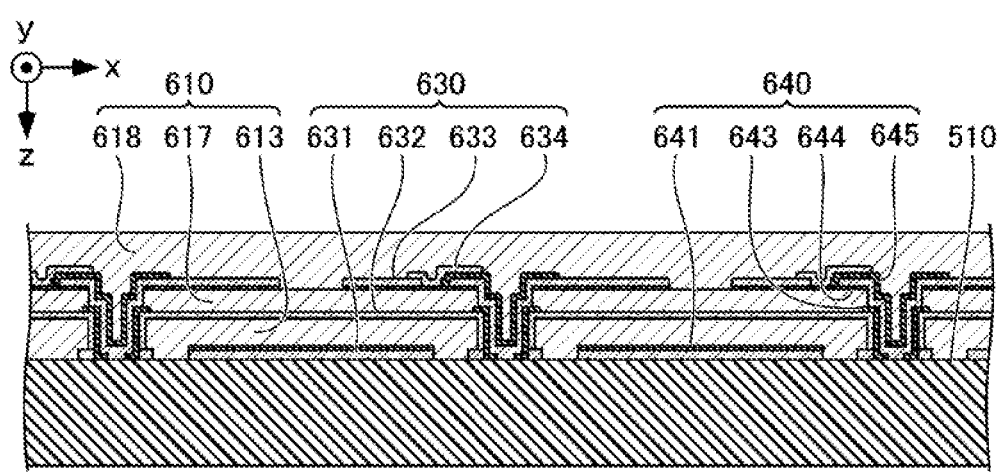
FIG. 23 is a cross-sectional view showing the process of manufacturing the spatial light modulator 500.

Then, as shown in FIG. 23, the sacrifice layer 618 covering the existent sacrifice layer 617, the conductor layers 633 and 634, and the insulation layer 645 is formed to flatten the entirety. The surface of the sacrifice layer 618 formed in this stage is positioned at theme height as the bottom surface of the reflecting mirror 544 relative to the substrate 510.

Figure 24:
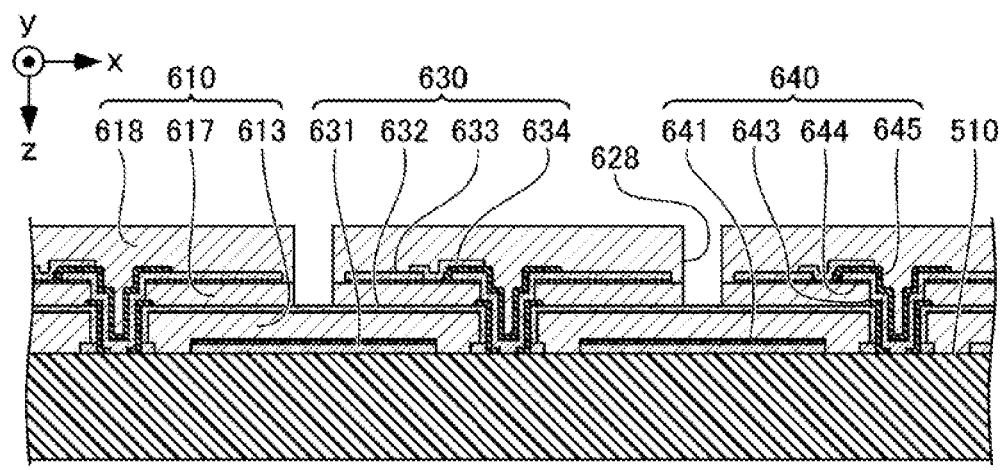
FIG. 24 is a cross-sectional view showing the process of manufacturing the spatial light modulator 500.

Subsequently, as shown in FIG. 24, an opening pattern 628 reaching the center of the conductor layer 632 is formed by patterning the sacrifice layer 618. Here, the width of the opening pattern 628 is narrower than the width of the opening pattern penetrating the conductor layer 633 and insulation layer 644, and the side edge portions of the conductor layer 633 and insulation layer 644 are buried inside the sacrifice layers 617 and 618. On the one hand, in the opening pattern 628, the top surface, in the figure, of the conductor layer 632 which is to be the movable electrode 524 appears.

Figure 25:
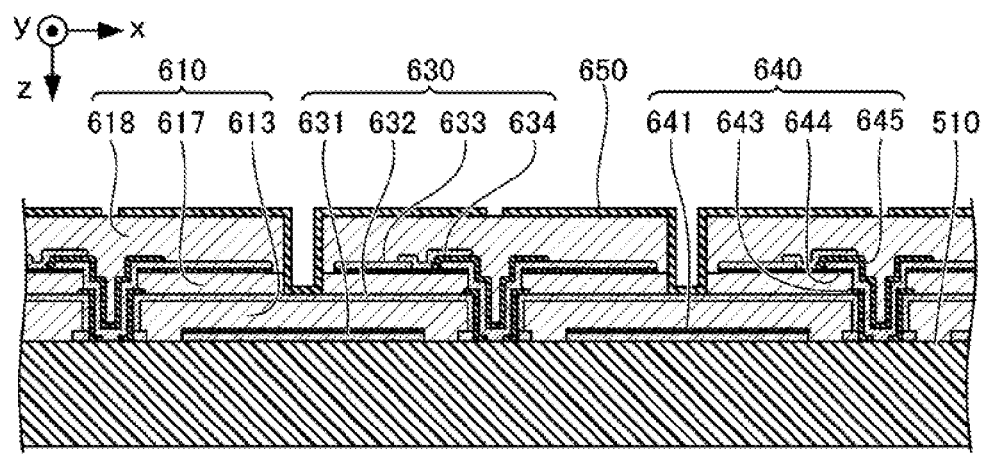
FIG. 25 is a cross-sectional view showing the process of manufacturing the spatial light modulator 500.

Then, as shown in FIG. 25, a reflecting layer 650 is formed by patterning and depositing a reflective material on the entire surface of the sacrifice layer 618, 617 and the conductor layer 632. The horizontal portion in the figure of the reflecting layer 650 is separated in the region overlapping the mutual gap of the conductor layer 632. Also, the reflecting layer 650 is coupled with the conductor layer 632 inside the opening pattern 628 for every mutually separated region.

The reflecting layer 650 may be formed by a metallic material. Also, the reflecting layer 650 may be formed by a dielectric multi-layer. In addition, the reflecting layer 650 may be formed by a composite thin film formed by laminating an inorganic material such as amorphous silicon, silicon nitride, etc. and a metal layer or a dielectric multi-layer. The thin film which forms the reflecting layer 650 or the reflecting layer 650 can be formed by various physical vapor deposition methods and chemical vapor deposition methods.

When forming the reflecting layer 650, mirror polishing may be performed on a surface of the sacrifice layer 618 that is to be the underlayer of the reflecting mirror 544. Also, when forming the reflecting layer 650 by a composite thin film, the mirror polishing of the underlayer may be performed before forming a metal layer or a dielectric multi-layer directly reflecting the irradiated light. Thereby, the flatness of the reflecting mirror 544 is improved and the reflectance of the spatial light modulator 500 eventually obtained is improved.

Figure 26:
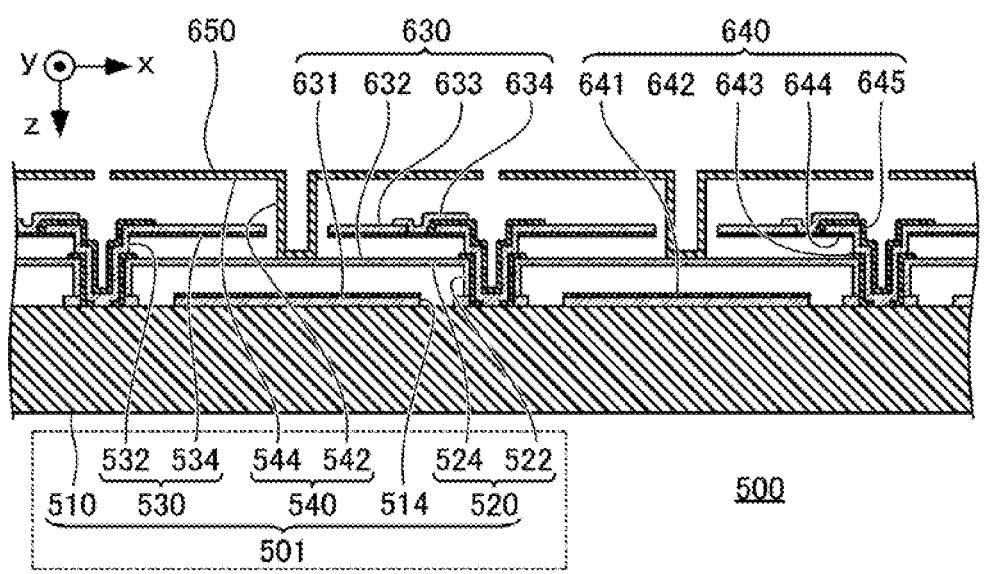
FIG. 26 is a cross-sectional view of the spatial light modulator 500.

Next, as shown in FIG. 26, all of the sacrifice layers 613, 617, 618 are removed and the spatial light modulator 500 is completed. In the cross section illustrated in the figure, a portion of the sacrifice layer 613 appears as if it is separated from the other sacrifice layers 617 and 615 by the conductor layer 632. However, as shown in FIG. 3, the conductor layer 632 forming the movable portion 520 does not cover all over the sacrifice layer 613. Thus, all of the sacrifice layers 613, 617, and 618 are continuous and can be removed collectively by the etching using gas or liquid.

In FIG. 26, the reference numerals for each of the elements of the spatial light modulation element 501 shown in FIG. 3 are shown with the enclosing dotted line. As illustrated in the figure, a portion of the conductor layer 631 forms the lower electrode 514. Also, the conductor layer 632 forms the support 522 of the movable portion 520 and the movable electrode 574.

In addition, a portion of the conductor layer 633 forms the support 532 of the fixed portion 530. Furthermore, the other portion of the conductor layer 633 and the conductor layer 634 form the top electrode 534. Then, the reflecting layer 650 forms the support member 542 and the reflecting mirror 544.

Here, the support 522 formed by the conductor layer 632 supports the movable electrodes 524 of the spatial light modulation elements 501, which are placed adjacent to each other jointly. Thereby, each one of the plurality of top electrodes 534 in the spatial light modulator 500 is supported by the supports 532 at the four corners, assuring the positioning as well as guaranteeing a high support stiffness. Also, at significant increase in the number of the supports 532 compared to the number of the top electrodes 534 is restrained, and the supports 532 can be prevented from decreasing the area which can be spared for the lower electrode 514 on the surface of the substrate 510.

In each of the plurality of spatial light modulation elements 501 appearing in the figure, each of the lower electrode 514, the top electrode 534, and the to movable electrode 524 is individually coupled with the substrate 510 for each spatial light modulation element 501. Thus, voltage can be applied individually by the CMOS circuit built in the substrate 510 for each spatial light modulation element 501 and to the lower electrode 514, movable electrode 524, and top electrode 534.

In the example illustrated in the figure, the movable electrode 524, the top electrode 534, and the reflecting mirror 544 all comprise flat cross-section shapes. However, a step-shaped or rib-shaped portion may be provided in the movable electrode 524, the top electrode 534, and the reflecting mirror 544 to improve the bending stiffness of the movable electrode 524, the top electrode 534, and the reflecting mirror 544.

Also, while the fabrication of the spatial light modulator 500 alone is described in the above example, many spatial light modulators 500 may be collectively fabricated by cutting into pieces by dicing after forming a plurality of spatial light modulators 500 comprising a plurality of spatial light modulation elements 501 on a single wafer Thereby, the productivity is improved and the cost of the spatial light modulator 500 can be lowered.

In addition, the sacrifice layer 618 covering the reflecting portion 540 is preferably preserved until the dicing completes in case the plurality of spatial light modulators 500 are collectively fabricated. Thereby, the facet resulted from dicing can be prevented from being attached on the reflecting mirror 544.

Figure 27:
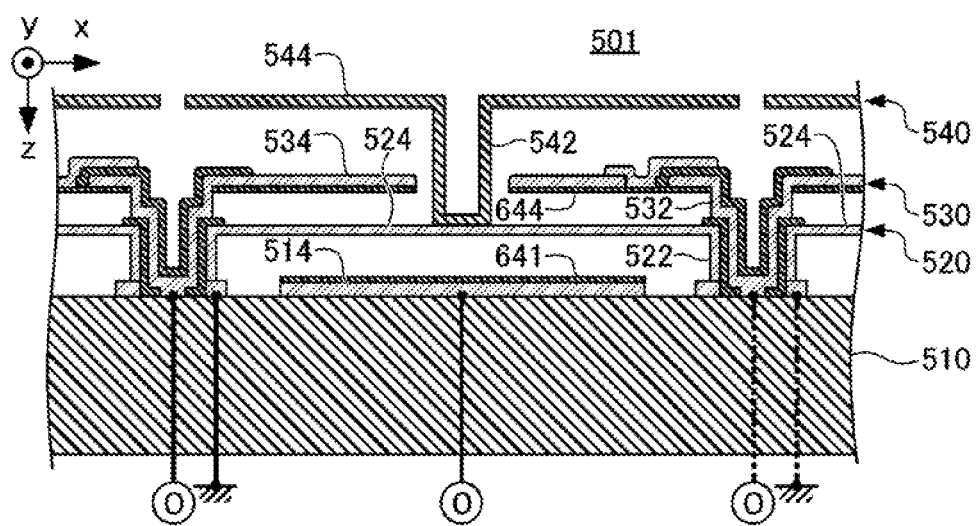
FIG. 27 is a cross-sectional view of the spatial light modulation element 501.

FIG. 27 is a cross-sectional view showing one spatial light modulation element 501 in a completed spatial light modulator 500. In each of spatial light modulation elements 501, the lower electrode 514, the movable electrode 524, and the top electrode 534 are respectively connected to the CMOS circuit built in the substrate 510. Thereby, the lower electrode 514, the movable electrode 524, and the top electrode 534 can be respectively set at individual electrical potentials.

In an example, illustrated in the figure, the movable electrode 524 is directly connected to the reference potential and constantly maintains the reference potential. In case of the illustration in the figure, the movable electrode 524 of the adjacent spatial light modulation element 501 is also individually connected to the reference potential. However, by connecting the movable electrodes 524 of reciprocal spatial light modulation elements 501 in the spatial light modulator 500, the connections to the reference potential in the substrate 510 may be assembled in one place. Thereby, the wirings of the CMOS circuit in the substrate 510 can be simplified.

Figure 28:
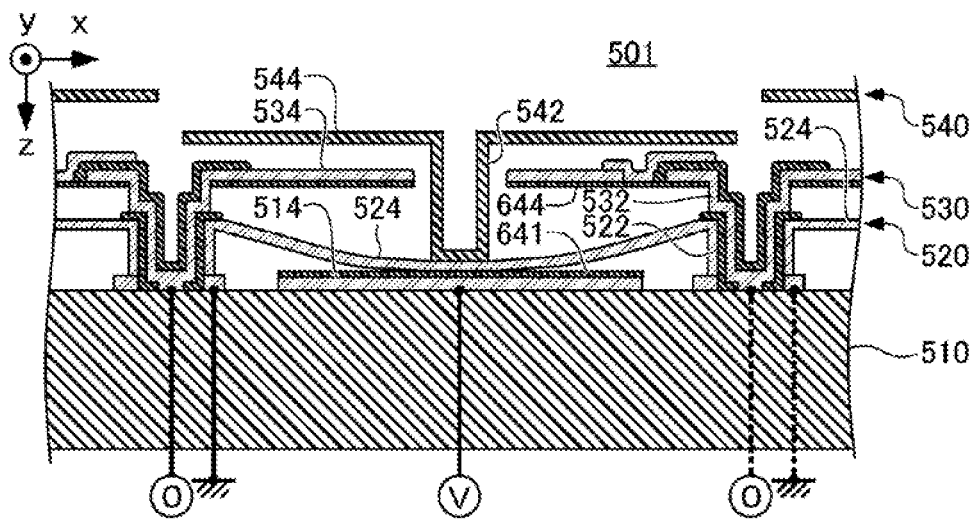
FIG. 28 is a cross-sectional view showing an operation of the spatial light modulation element 501.

FIG. 28 is a cross-sectional view showing the state in which the driving voltage is applied to the lower electrode 514 in the spatial light modulation element 501. As the driving voltage is applied to the lower electrode 514, a potential difference arises between the movable electrode 524 set at the reference potential and the lower electrode 514. Thereby, the lower electrode 514 adsorb the movable electrode 524 by the electrostatic force generated between the movable electrode 524 and the lower electrode 514 and attracts the reflect log portion 540 which is displaced integrally with the movable electrode 524 toward the substrate 510.

The movable electrode 524 adsorbed on the lower electrode 514 positions the reflecting portion 540 by abutting on the lower electrode 514. At this time, the insulation layer 641 provided on the surface of the lower electrode 514 prevents the shorting of the lower electrode 514 and the movable electrode 524.

During the period for which the driving voltage is applied to the lower electrode 514, the driving voltage is not applied to the top electrode 534. In addition, in this case, the potential difference between the top electrode 534 and the movable electrode 524 is preferably eliminated by connecting the top electrode 534 to the reference potential.

Figure 29:
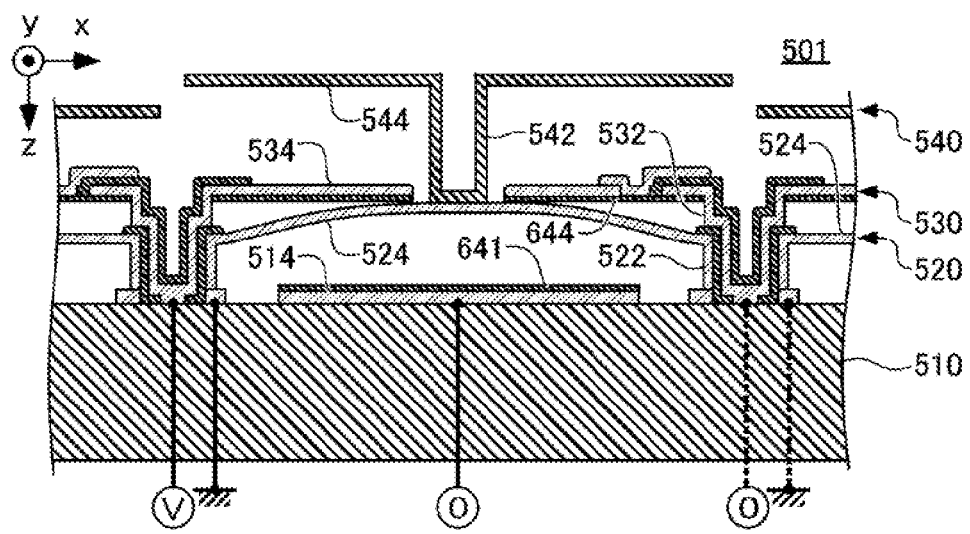
FIG. 29 is a cross-sectional view showing an operation or the spatial light modulation element 501.

FIG. 29 is a cross-sectional view showing the state in which driving voltage is applied to the top electrode 534 in the spatial light modulation element 501. As driving voltage is applied to the top electrode 534, a potential difference arises between the movable electrode 524 set at the reference potential and the top electrode 534. Thereby, the top electrode 534 adsorbs the movable electrode 524 by the electrostatic three generated between the movable electrode 524 and the top electrode 534 and attracts the reflecting portion 540 which is displaced integrally with the movable electrode 524 toward a position as from the substrate 510.

In the course of time, the movable electrode 524 adsorbed on the top electrode 534 is positioned where it is abutting on the top electrode 534. Thereby, the reflecting portion 540 which is displaced integrally with the movable electrode 524 is also positioned in a position away from the substrate 510. At this time, the insulation layer 644 provided on the bottom surface in the figure of the top electrode 534 prevents the shorting of the top electrode 534 and the movable electrode 524.

Also, the top electrode 534 is supported between the supports 532 at the four locations. In addition, each of the top electrode 534 and the support 532 are coupled to the short coupling portion 533 which hardly becomes deformed. Thus, even when the movable electrode 524 is adsorbed by resisting the elasticity of the flexure 526, the position of the electrode 534 changes or the top electrode 534 itself is prevented from becoming deformed. Thus, the movable electrode 524 and the reflecting portion 540 abutting on the top electrode 534 are positioned with a good precision even in a position away from the substrate 510.

During the period of time for which the driving voltage is applied to the top electrode 534, the driving voltage is not applied to the lower electrode 514. In addition, in this case, is preferable that the lower electrode 514 is connected to the reference potential and the potential difference between the lower electrode 514 and the movable electrode 524 is eliminated.

Also, the movable electrodes 524 are mutually connected to the same reference potential in the spatial light modulator 500 comprising a plurality of spatial light modulation elements 501. Thus, the supports 522 supporting the movable electrodes 524 and the movable electrodes in the spatial light modulator 500 can all be electrically coupled. In this case, the conductor layers 632 may be mutually and electrically coupled in the entire spatial light modulator 500.

In addition, in the above example described by referring to FIG. 27 through FIG. 29, it is configured in a manner that the driving voltage is applied to the lower electrode 514 and the top electrode 534 with the movable electrode 524 as the reference potential. However, the driving voltage may be applied to the other electrode by fixing the electrical potential of the lower electrode 514 or the top electrode 534.

In that case, the lower electrode 514 or the top electrode 534 of which the electrical potential is fixed at the reference potential may be electrically coupled spatial light modulation element 501 mutually with each other. In particular, when the top electrodes 534 are configured to be commonly coupled with the reference potential, the formation of the insulation layer 645 which insulates the top electrodes 534 between the spatial light modulation elements 501 can be omitted.

Also, the insulation layers 641 and 644 provided on the lower electrode 514 and the top electrode 534 for the purpose of preventing the shorting with the movable electrode 524 can be replaced with an insulation layer provided on the top surface and the bottom surface of the movable electrode 524. In addition, the configuration may be in a manner that the insulation layer is provided on the top surface of the lower electrode 514 and the top surface of the movable electrode 524, or that the insulation layer is provided on the bottom surface of the movable electrode 524 and the bottom surface of the top electrode.

Moreover, if the movable electrode 524 can be prevented from directly making a contact with the lower electrode 514 and top electrode 534, the insulation layer may be provided in a portion of the movable electrode 524 and a portion of the lower electrode 514 or top electrode 534 to the extent that prevents the shorting of the movable electrode 524 with the lower electrode 514 and the top electrode 534. In the examples shown in FIG. 28 and FIG. 29, the movable electrode 524 and the lower electrode 514 and top electrode 534 all make contact in the vicinity of the center, and thus the insulation layers 641, 644 are sufficient if they are formed to the vicinity of the center of the lower electrode 514 and the top electrode 534.

In addition, in the above example, the spatial light modulator 500 was formed by aligning the plurality of spatial light modulation elements 501 each comprising a rectangular reflecting mirror 544. For this reason, it was configured in a manner that each of spatial light modulation elements 501 also has a rectangular planar shape, and the movable electrode 524 and the top electrode 534 are supported by the four supports 522, 532 placed in the four corners of the rectangle. However, the planar shape of the spatial light modulation element 501 is not limited to being rectangular.

For example, the spatial light modulator 500 can be formed by making the reflecting mirror 544 triangular and filling the plane by the spatial light modulation elements 501 having a triangular planar shape. In this case, it is structured in a manner that the lower electrode 514, the movable electrode 524, and the top electrode 534 are also made triangular and the movable electrode 524 and the top electrode 534 are supported by the three supports 522, 532 placed at the vertexes of this triangle. Thereby, the supports 522, 532 can be shared among the adjacent spatial light modulation elements 501.

Also, the spatial light modulator 500 in also be formed by, for example, making the reflecting mirror 544 hexagonal in shape and filling the plane with the spatial light modulation elements 501 having a hexagonal planar shape. In this case, it is structured in a manner that the lower electrode 514, the movable electrode 524, and the top electrode 534 are also respectively made hexagonal in shape, and the movable electrode 524 and the top electrode 534 are supported by the six supports 522, 532 placed at the vertexes of this hexagon. Also, it may be structured in a manner that the movable electrode 524 and the top electrode 534 are supported by placing three supports 522, 532 at every other vertex of the vertexes of the hexagon. In any case, the supports 522, 532 can be shared among the adjacent spatial light modulation elements 501.

Figure 30:
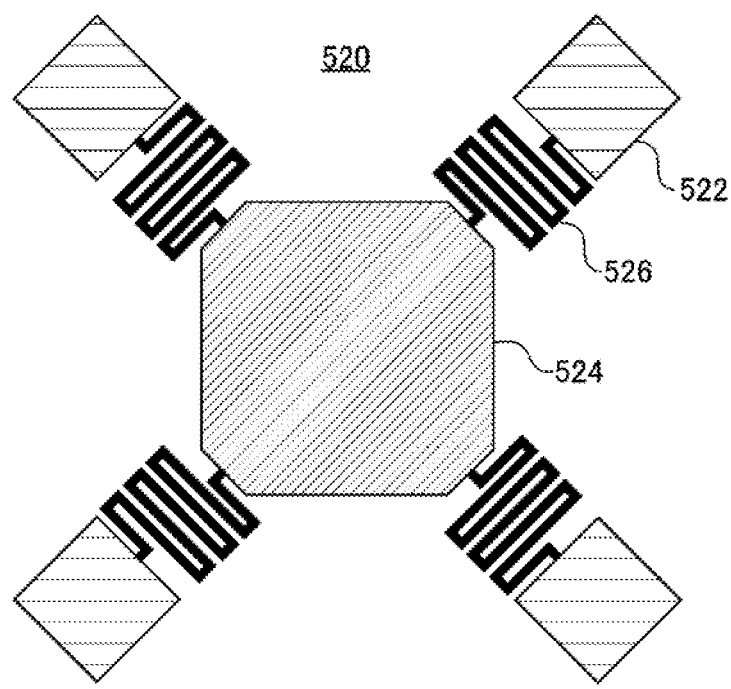
FIG. 30 is a plan view showing the shape of the movable portion 520.

FIG. 30 is a schematic plan view showing the other shape of the movable portion 520. In the movable portion 520, the shape of the flexure 526 is not limited to the circular shape already indicated. For example, as shown in FIG. 30, the shape of the flexure 526 may be a shape that is deformable by bending. In addition, the flexure 526 can have various shape such as spiral, pantagraph-shaped, etc. if it is a shape that does not prevent the movable electrode 524 in the movable portion 520 from being displaced relative to the substrate 510.

Figure 31:
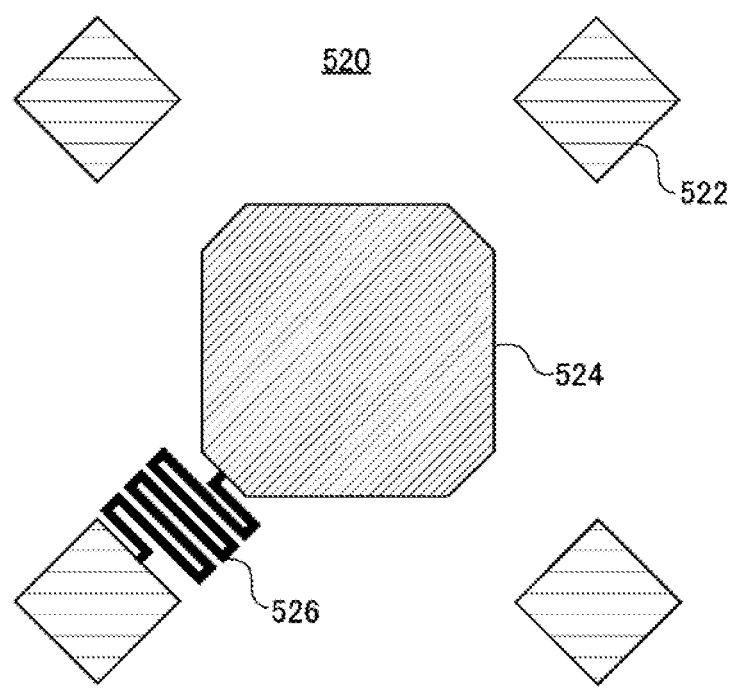
FIG. 31 is a plan view showing the shape of the movable portion 520.

FIG. 31 is a schematic plan view showing the other shape of the movable portion 520. As described by referring to FIG. 27 through FIG. 29, the movable electrode 524 is adsorbed by either the lower electrode 514 or the top electrode 534 and positioned in a predetermined position when the spatial light modulator 500 is in operation. Thus, the flexure 526 in the movable portion 520 may not exactly position the movable electrode 524.

Then, as shown in FIG. 31, the movable electrode 524 may be a cantilever structure in the movable portion 520. In other words, the flexure 526 is sufficient if the movable electrode 524 can be prevented from falling or being stuck, etc., and the positioning may not be performed.

The present invention is not limited to applications in an exposure apparatus for manufacturing a semiconductor device, and it can be broadly applied also in, for example, an exposure apparatus for a display device such as a liquid crystal display element formed on a rectangular glass plate or a plasma display, an exposure apparatus for manufacturing each kind of device such as an imaging element (CCD, etc.), a micromachine, a thin film magnetic head, and as DNA chip. In addition, the present invention can be applied also in an exposure apparatus for manufacturing a mask with the mask pattern of each kind of device formed (photomask, reticle, etc.) using the lithography process. As above, the object to be exposed on which an enemy beam is irradiated in each embodiment described above is not limited to a wafer, and it may be the other object such as a glass plate, a ceramic substrate, or mask blanks.

The semiconductor device is manufactured through a step of designing the functions/performance of the device, as step of forming a wafer from materials, a step of exposing the wafer via a variably molded mask by the exposure apparatus of the above embodiment, a step of forming a circuit pattern such as etching, a step of assembling the device (including a dicing process, a bonding process, and a packaging process), and an inspection step.

While the embodiments of the present invention have been described as above, the technical scope of the present invention is not limited to the scope described in the above described embodiments. It is apparent to persons skilled in the art that various alterations and improvements can be added to the above described embodiments. It is also apparent from the description of the scope of the claims that the embodiments added with such alterations or improvements may be included in the technical scope of the present invention.

It should be noted that each process of the operations, procedures, steps, and stages, etc. in an apparatus, system, program, and method shown in the claims, specification and diagrams can be performed in any order as long as the order is not indicated by "prior to," "before," or the like and also, as long as the output from a previous process is not used in a later process. Even if the procedure is described using phrases such as "first" or "next", etc. in the claims, specification, and diagrams for convenience, it does not necessarily mean that the process must be performed in this order.

EXPLANATION OF REFERENCES 100 semiconductor exposure apparatus, 200 control system, 210 main control unit, 220 stage control unit, 230 light source control unit, 240 modulation control unit, 300 illumination system, 301 optical system, 310 light source, 320 beam expander, 330 polarization control optical element, 340 diffraction optical element, 352, 354 relay optical system, 360 microlens array, 370 relay lens, 380 field stop, 382 COP, 391, 392, 393 reflecting mirror, 400 photolithographing system, 410 projection optical system, 420 wafer stage, 422 reflecting mirror, 430 stage driving unit, 440 interferometer, 450 semiconductor wafer, 500 spatial light modulator, 501 spatial light modulation element, 502, 522, 532 support, 510 substrate, 514 lower electrode, 520 movable portion, 524 movable electrode, 526 flexure, 530 fixed portion, 533 coupling portion, 534 top electrode, 536 opening portion, 540 reflecting portion, 542 support member, 544 reflecting mirror, 610, 611, 613, 617, 618 sacrifice layer, 623, 624, 625, 626, 627, 628 opening pattern, 630, 631, 632, 633, 634 conductor layer, 640, 641, 643, 644, 645 insulation layer, 650 reflecting layer, 660 slit pattern

What is claimed is:

1. A spatial light modulator comprising:
   a substrate;
   a first light modulation element comprising a reflecting mirror, a movable portion which is displaced relative to the substrate while supporting the reflecting mirror, and a top electrode which adsorbs the movable portion by the electrostatic force between the movable portion and the top electrode in a position which is farther away from the substrate than the movable portion is from the substrate;
   a second light modulation element placed adjacent to the first light modulation element in the substrate, comprising a reflecting mirror, a movable portion which is displaced relative to the substrate while supporting the reflecting mirror, and a top electrode which adsorbs the movable portion by the electrostatic force between the movable portion and the top electrode in a position farther away from the substrate than the movable portion is from the substrate; and
   an electrode supporting portion which jointly supports the top electrode of the first light modulation element and the top electrode of the second light modulation element relative to the substrate,
   wherein either (i) the top electrode of the first modulation element and the top electrode of the second modulation element are electrically insulated from each other, (ii) the movable portion of the first light modulation element and the movable portion of the second light modulation element are electrically insulated from each other, or (iii) the top electrode of the first modulation element and the top electrode of the second modulation element are electrically insulated from each other and the movable portion of the first light modulation element and the movable portion of the second light modulation element are electrically insulated from each other, and
   wherein voltage is applied individually to the electrically insulated electrodes and elements.

2. The spatial light modulator according to claim 1, wherein the top electrode of each of the first light modulation element and the second light modulation element is supported between a plurality of the electrode supporting portions.

3. The spatial light modulator according to claim 1, wherein the top electrode of each of the first light modulation element and the second light modulation element is electrically coupled to an electrical circuit provided on the substrate via a relay wiring layer placed along the electrode supporting portion.

4. The spatial light modulator according to claim 3, wherein the relay wiring layer coupled to the top electrode of the first light modulation element is electrically insulated with respect to the top electrode of the second light modulation element.

5. The spatial light modulator according to claim 1, wherein the top electrode in each of the first light modulation element and the second light modulation element comprises a conductor pattern which is symmetrical with respect to a reflecting mirror supporting portion that supports the reflecting mirror.

6. The spatial light modulator according to claim 1, wherein at least one of the top electrode and the movable portion in each of the first light modulation element and the second light modulation element further comprises an insulation layer which insulates between the top electrode and the movable portion.

7. The spatial light modulator according to claim 1, wherein each of the first light modulation element and the second light modulation element is fixed on the surface of the substrate and further comprises a lower electrode which adsorbs the movable portion by the electrostatic force between the movable portion and the lower electrode.

8. The spatial light modulator according to claim 1, wherein a displaced amount of the movable portion relative to the substrate has, with respect to an integral multiple of a wavelength of the light reflected by the reflecting mirror, a difference of a ¼ of the wavelength.

9. The spatial light modulator according to claim 1, wherein each of the top electrodes is supported by at least three of the electrode supporting portions which are not aligned in a straight line.

10. The spatial light modulator according to claim 1, wherein the movable portion is coupled to the substrate by a single coupling portion.

11. A photolithographing apparatus for drawing a light figure using the spatial light modulator according to claim 1.

12. An exposure apparatus for exposing a semiconductor using the photolithographing apparatus according to claim 11.

13. A method of manufacturing a device comprising a lithography process, wherein an exposure is performed in the lithography process using the exposure apparatus according to claim 12.

* * * * *